(12) United States Patent
Schaefer et al.

(10) Patent No.: US 7,068,079 B2
(45) Date of Patent: *Jun. 27, 2006

(54) CIRCUIT DEVICE WITH CLOCK PULSE DETECTION FACILITY

(75) Inventors: Andre Schaefer, Munich (DE); Johann Pfeiffer, Ottobrunn (DE); Kasimierz Szczypinski, München (DE); Joachim Schnabel, München (DE)

(73) Assignee: Infineon Technologies AG, Munich (DE)

(*) Notice: Subject to any disclaimer, the term of this patent is extended or adjusted under 35 U.S.C. 154(b) by 8 days.

This patent is subject to a terminal disclaimer.

(21) Appl. No.: 10/668,683

(22) Filed: Sep. 23, 2003

(65) Prior Publication Data

US 2004/0124887 A1  Jul. 1, 2004

(30) Foreign Application Priority Data

Sep. 24, 2002 (DE) ............................... 102 44 400

(51) Int. Cl.
G01R 19/00 (2006.01)
H03K 5/19 (2006.01)

(52) U.S. Cl. .......................................... 327/18; 327/72
(58) Field of Classification Search ............ 327/18–20, 327/22–24, 26–29, 291–292, 298
See application file for complete search history.

(56) References Cited

U.S. PATENT DOCUMENTS

| 6,433,607 B1* | 8/2002 | Kawasaki et al. .......... 327/299 |
| 6,737,892 B1* | 5/2004 | Jong et al. .................... 327/18 |
| 6,791,369 B1* | 9/2004 | Hattori ........................ 327/52 |
| 6,794,919 B1* | 9/2004 | Volk et al. .................. 327/291 |
| 2001/0043099 A1 | 11/2001 | Kawasaki et al. .......... 327/158 |

* cited by examiner

Primary Examiner—My-Trang Nu Ton
(74) Attorney, Agent, or Firm—Marshall, Gerstein & Borun LLP

(57) ABSTRACT

The invention refers to a circuit device (1) with at least one connection (3b), to which a clock pulse (/CLK, /CLK$_T$) can be applied, whereby the circuit device (1) also comprises a clock pulse detection facility (2) for detecting whether there is a clock pulse (/CLK, /CLK$_T$) present at the connection (3b), or whether there is no clock pulse (/CLK, /CLK$_T$) present at the connection (3b).

10 Claims, 2 Drawing Sheets

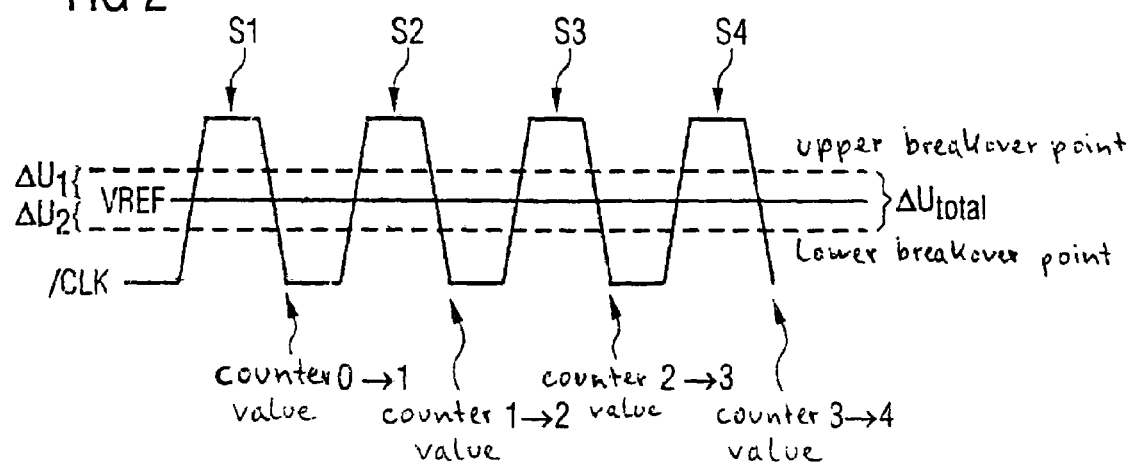

CIRCUIT DEVICE WITH CLOCK PULSE DETECTION FACILITY

FIELD

The invention relates to a circuit device with at least one connection to which a clock pulse can be applied, as well as a semi-conductor component with a respective circuit device.

BACKGROUND

In semi-conductor components, more particularly memory components such as DRAMs (DRAM=Dynamic Random Access Memory and/or dynamic read/write memory) based on CMOS technology, so-called clock pulses are used for the chronological coordination of the processing and/or relaying of data.

Conventional semi-conductor components use one "single-ended" clock pulse—present on a single line—for this purpose.

The data may then for instance be relayed at any time by means of the ascending pulse flank of the single-ended clock pulse (or alternatively at any time for instance by means of the descending pulse flank of the single-ended clock pulse).

In conventional technology so-called DDR components, more particularly DDR-DRAMs (DDR-DRAM=double data rate DRAMs and/or DRAMs with a double data rate) are already well known.

In DDR-DRAMs, two differential, inverse clock pulses present on two separate lines are used, instead of one single clock pulse ("single ended" clock pulse) present on a single line.

Every time, for instance, when the first of the two clock pulses changes from a "high logic" state (i.e. a high voltage level) to a "low logic" state (i.e. a low voltage level), the second clock pulse—essentially simultaneously—changes its state from "low logic" to "high logic" (e.g. from a low to a high voltage level).

Conversely, whenever the first clock pulse changes from a state of "low logic" (e.g. from a low voltage level) to a state of "high logic" (e.g. a high voltage level), the second clock pulse (again essentially simultaneously) changes its state from "high logic" to "low logic" (e.g. from a high to a low voltage level).

With DDR-DRAMS, data is relayed by both the ascending flank of a particular clock pulse and the descending flank of the same clock pulse.

This means that data is relayed more frequently and/or faster (more particularly, twice as frequently and/or twice as fast) with a DDR-DRAM relaying the data, than with corresponding conventional DRAMs using "single ended" clock pulses; in other words the data rate of DDR-DRAMs is twice as high as that of corresponding conventional DRAMs.

DDR-DRAMs contain two pulse connections and in the normal operating mode of a DRAM, the above-mentioned first clock pulse—generated by an external clock pulse trigger—is applied to the first pulse connection of the DRAM, and the second clock pulse—also generated by the external clock pulse trigger but inverted in relation to the first clock pulse—is applied to the second clock pulse connection.

When the DDR-DRAM is tested before being put into use (i.e. when it is operated in test mode instead of in the normal operating mode)—for instance by means of a special external test apparatus—the relevant clock pulses, instead of being generated by an external clock pulse trigger, are generated by an external test apparatus and applied to the relevant DRAM connections.

Thereby the above-mentioned differential test clock pulse generated by the test apparatus—corresponding with the relevant differential clock pulse—can be applied to the corresponding first and second pulse connections of the DDR components, or alternatively the test apparatus may simply generate one single-ended test clock pulse, corresponding with a clock pulse from a current component using only one single clock pulse.

This single test clock pulse is, for example, simply applied to the first pulse connection of the DRAMs (at the second component pulse connection there will then be no (test) clock pulse present, but for instance a voltage, VREF; this voltage is needed for operating the DDR-DRAMs, i.e. it must be supplied by the test apparatus and may during the test be applied to the second pulse connection as well).

By using one single test clock pulse (instead of the above two inverted test clock pulses), test channels can be spared in the relevant test apparatus being used.

Apart from this, it becomes possible for a test apparatus designed for testing currently available components and using one single-ended clock pulse (or a similar and/or corresponding test apparatus) to be used for testing DDR-DRAMs designed to be tested by differential test clock pulses.

SUMMARY

This invention is aimed at providing a novel circuit device, as well as a novel semi-conductor component.

These and other aims are achieved by means of the subject matter of Claims 1 and 10.

Further advantageous developments of the invention are listed in the subsidiary claims.

According to a basic concept of the invention, a circuit device is provided that has at least one connection, to which a clock pulse may be applied, and where the device also has a pulse detection facility for determining whether a clock pulse (/CLK, /CLK$_T$), is present at the connection (or—specifically—whether there is no clock pulse (/CLK, /CLK$_T$) present at the connection).

It is especially advantageous that the circuit device has an additional connection—apart from the above (first) connection—to which a further clock pulse (CLK, CLK$_T$) can be applied, whereby it is determined, by determining whether a clock pulse (/CLK, /CLK$_T$) is present at the (first) connection (or not), whether there are differential clock pulses (CLK, CLK$_T$ /CLK; /CLK$_T$) present at the connections, or whether there is a single clock pulse (CLK, CLK$_T$) present at the additional, but not at the (first) connection.

Preferably and depending on whether it is determined that a single clock pulse, or differential clock pulses are present at the additional connection, and/or at the connections, a pulse relay facility, specially arranged for single clock pulses, or a pulse relay facility, specially arranged for differential clock pulses, can be used and/or activated for receiving clock pulses present at the additional connection and/or the connections and relaying these (after being correspondingly retimed, reshaped, and/or reamplified for instance) to further circuit devices provided in the corresponding component.

BRIEF DESCRIPTION OF THE DRAWINGS

The invention is more closely described below with the use of an examplifying embodiment and the accompanying drawings. In the drawings:

FIG. 2 shows a schematic representation of the chronological progress of the reference voltage used in the clock pulse detection facility according to FIG. 1, and the clock pulse to be detected.

DETAILED DESCRIPTION OF VARIOUS EMBODIMENTS

Figure 1:
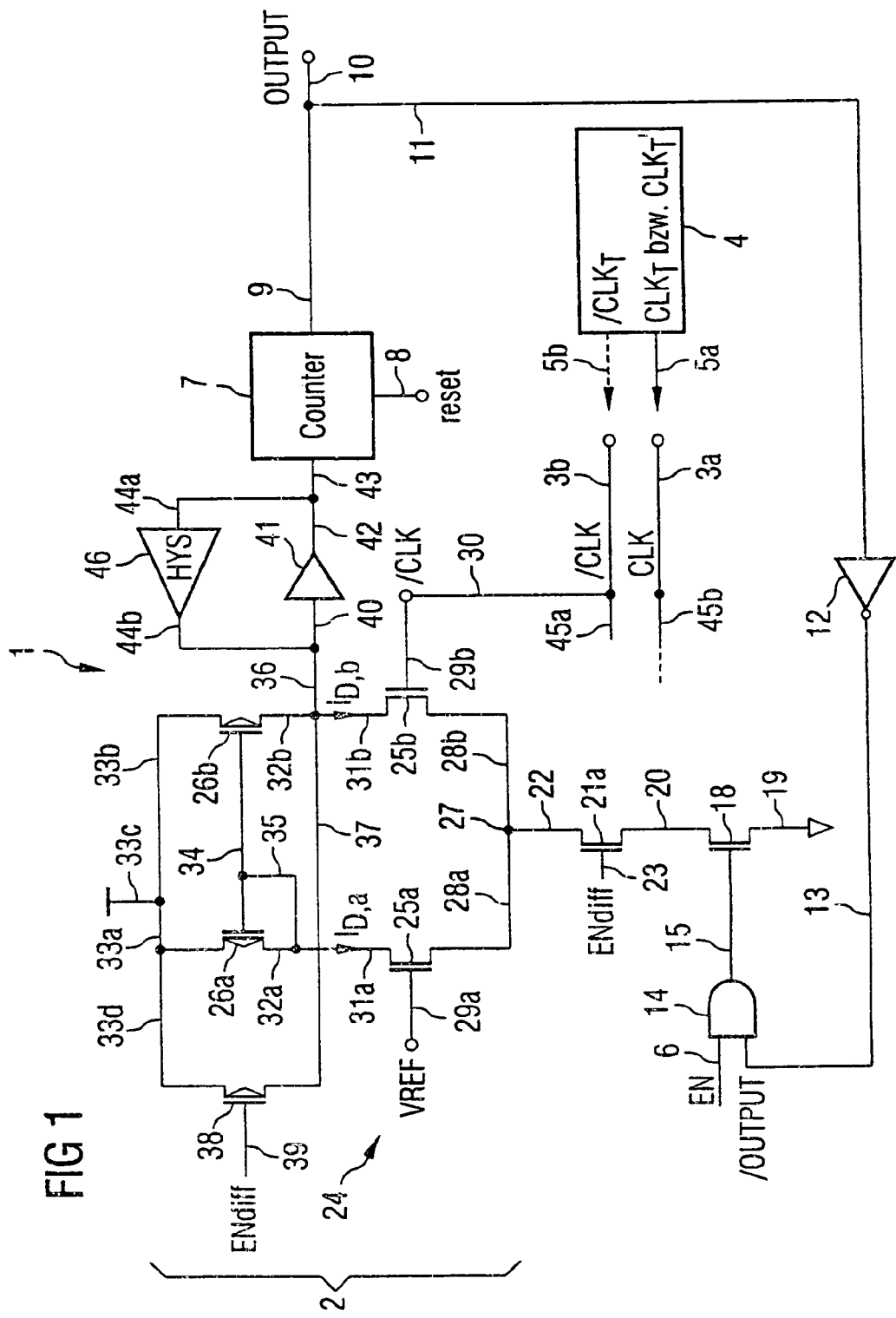
FIG. 1 shows a schematic representation of the first section of a circuit device with a clock pulse detection facility according to an examplifying embodiment of the present invention.

FIG. 1 shows a schematic representation of a circuit device 1 with a clock pulse detection facility 2 as shown in an embodiment example of the present invention.

The circuit device 1 may for instance be built into a semi-conductor component—for instance into a DRAM memory component (DRAM=Dynamic Random Access Memory and/or dynamic Read/Write Memory) based on CMOS technology.

The DRAM memory component may for instance be a DDR-DRAM (DDR-DRAM=Double Data Rate—DRAM and/or DRAM with double data rate).

This component has two pulse connections 3a, 3b, with which—in the normal operating mode of the DDR-DRAM—a first clock pulse CLK from an external (i.e. an outside) clock pulse trigger—is applied to the first pulse connection 3a—and a second clock pulse /CLK from the same external trigger to the second pulse connection 3b.

These two clock pulses, CLK and /CLK, for example refer to so-called differential, i.e. inverse clock pulses: for instance, whenever the first clock pulse CLK changes its state from "high logic" to "low logic", the second clock pulse /CLK—essentially simultaneously—changes its state from "low logic" to "high logic".

Conversely, the second clock pulse /CLK—essentially simultaneously—changes its state from "high logic" to "low logic" whenever the first clock pulse CLK changes from a "low logic" to a "high logic" state.

The above double data rate (in contrast to conventional components using only a single clock pulse CLK) is attained in a DDR-DRAM when the relevant data—within the DDR-DRAM—is not only relayed by the ascending pulse flank of a clock pulse (e.g. of the above single ended clock pulse CLK), but also by the descending flank of the clock pulse CLK—i.e. twice as frequently as in conventional DRAMs using the single ended clock pulse CLK.

When the DDR-DRAM is operated in a test mode (during which the DRAM is for instance being tested by a special external test apparatus 4) instead of in the above normal operation mode, the relevant clock pulses are applied by the external test device 4, instead of by the above external clock pulse trigger.

Hereby the test apparatus 4 can either emit the differential test clock pulses $CLK_T$, $/CLK_T$—corresponding with the differential clock pulses CLK, /CLK—(whereby the first test clock pulse $CLK_T$, corresponding with the above first clock pulse CLK, is applied to the first pulse connection 3a via a first line 5a, and a second test clock pulse $/CLK_T$ (corresponding with the second clock pulse /CLK) to connection 3b via a second line 5b (shown hatched in FIG. 1) and inverted in relation to the first test clock pulse $CLK_T$ applied by the test apparatus 4).

Alternatively, the test apparatus 4 can simply emit one single ended test clock pulse $CLK_T$, (corresponding with a conventional component using one single clock pulse CLK ("single ended" clock pulse)). This single test clock pulse $CLK_T$ is then—as shown in FIG. 1—applied to the first pulse connection 3a of the component via the above first line 5a. (At the second component connection 3b there will then be no (test) clock pulse).

By using one single test clock pulse $CLK_T$ (instead of the above two inverted, differential test clock pulses $CLK_T$, $/CLK_T$), four test channels can be saved with the test device used at any time, and/or it can be used to test DDR-DRAMs (essentially) designed to use differential clock pulses, a test device 4 usually used to test conventional components using one single ended clock pulse (or a test apparatus correspondingly similar to this test device 4, or a slightly modified test device for instance).

By means of the circuit device shown in FIG. 1 (especially its clock pulse detection facility 2), it is determined whether the above clock pulse and/or test clock pulse CLK and/or $CLK_T$ are present at the component's second pulse connection or not.

From the fact that the above pulse CLK and/or test clock pulse $CLK_T$ is present at the second pulse connection 3b, it can be determined that there are differential clock pulses present at the whole component, especially at its clock pulse connections 3a, 3b, (in particular the above clock pulse and/or test clock pulse CLK and/or $CLK_T$ at the first connection 3 and the clock pulse and/or the test clock pulse /CLK and/or $/CLK_T$—inverted in relation to it—present at the second pulse connection 3b).

In contrast to this it can be determined from the fact that there is no clock pulse /CLK and/or test clock pulse $/CLK_T$ present at the second pulse connection 3b, that there is a single clock pulse present at the whole component (especially the single clock pulse and/or single test clock pulse CLK and/or $CLK_T$ present at the first pulse connection 3a).

When the DDR component is put into operation (i.e. when the component changes from a state of "power off" to "power on") the circuit device is enabled. In the process a "high logic" circuit device enabling signal EN is relayed via line 6 (and/or the circuit device enabling signal EN changes its state from "low logic" to "high logic".)

Furthermore,—also when the DDR component is put into operation—the counter position Z of a counter device 7 (here: a dual counter) is reset to a starting position (here: a counter initial value $Z_0=0$). For this a "high logic" counter clearing signal RESET is—momentarily—applied (and/or the counter reset signal changes its state from "low logic" to "high logic" (and then back again from "high logic" to "low logic")).

The counter device 7 is constructed in such a way that it emits a "low logic" signal at the output of the counter device 7 when it shows a reading Z of "zero" (i.e. at an initial counter value of $Z_0=0$).

The output of counter device 7 is connected to output 10 of the circuit device 1 via line 9 (at which a "low logic" signal OUTPUT is thereby also emitted).

Apart from being connected to output 10 of circuit device 1, line 9 (and thus also the output of the counter device 7) is also connected to the input of an inverter 12.

When—after the DDR component is put into operation and the counter device 7 has been reset as described above—a "low logic" signal is emitted by it and relayed via lines 9 and 11 to the input of the inverter 12, the inverter emits an inverted, i.e. "high logic" signal /OUTPUT.

The "high logic" signal /OUTPUT is relayed via a line 13 to a first input of an AND circuit link 14, at whose second input the circuit device enabling signal EN is applied via line 6.

Only when (as is the case after putting the DDR component into operation and resetting the counter device 7) the signal /OUTPUT,—relayed via line 13—as well as the circuit device enabling signal EN—relayed via line 6—is in a "high logic" state, a "high logic" signal is emitted by the output of the AND switching link 14, which is relayed to the gate of an n channel field effect transistor 18 (here: an n channel MOSFET 18) via a line 15.

As shown in FIG. 1, the drain of the n channel field effect transistor 18 is connected to the supply voltage via line 19, and the source via a line 20 to the drain of another n channel field effect transistor 21 (here: an n channel MOSFET 21) connected in series with the n channel field effect transistor 18.

When, as described above, a "high logic" signal is emitted at the output of the AND gate 14, the n channel field effect transistor 18 is switched on and/or through; the voltage at the source of the n channel field effect transistor 18 is then essentially equal to the voltage at its drain (here: GROUND potential).

The drain of the n channel field effect transistor 21 is connected via a line 22 to the actual clock pulse detection facility 2 (connected in series with the n channel field effect transistors 18, 21) of the circuit device 1, more particularly to a connection 27 of a differential amplifier 24.

The gate of the n channel field effect transistor 21 is connected to a line 23. When the DDR component is put into operation (i.e. when the component changes from a state of "power off" to a state of "power on"), a "high logic" differential amplifier enabling signal ENdiff is caused to be applied via line 23 to the gate of the n channel field effect transistor 21.

If there is a "high logic" differential amplifier enabling signal ENdiff present at the gate of the n channel field effect transistor 21, then the n channel field effect transistor 21 is switched on and/or through; the voltage at the drain of the n channel field effect transistor 21—and also the voltage at the differential amplifier connection 27—is essentially as high as the voltage at the source of the n channel field effect transistor 21, and then—with a switched on and/or through-connected n channel field effect transistor 18—also essentially as high as the voltage at the source of the n channel field effect transistor 18 (here: GROUND potential).

In this state, the differential amplifier 24 and/or the clock pulse detection facility 2 is "enabled", i.e. a comparison is made by the differential amplifier 24 and/or the clock pulse detection facility 2—in the manner described in detail below—between the voltage of the clock pulse /CLK and/or test clock pulse /CLK$_T$ and the reference voltage VREF.

If, in contrast to this, there is a "low logic" instead of a "high logic" signal present, either at the gate of the n channel field effect transistor 21 and/or at the gate of the n channel field effect transistor 18, the n channel field effect transistor 21 and/or the n channel field effect transistor 18 are switched off and/or blocked.

Due to the voltage drop between the drain and the source of the corresponding n channel field effect transistor 18 and/or 21, the voltage at the source of the n channel field effect transistor 21—and therefore also the voltage at the differential amplifier connection 27—will (necessarily) not be at GROUND potential any longer.

In this state, as is more clearly illustrated below, the differential amplifier 24 and/or the clock pulse detection facility 2 can then make no representation based on a relevant comparison between the voltage level of the clock pulse /CLK and/or test clock pulse /CLK$_T$ and the reference voltage VREF; the differential amplifier 24 and/or the clock pulse detection facility 2 are then "blocked".

As shown in FIG. 1, the differential amplifier 24 has two symmetrical n channel field effect transistors 25a, 25b connected in parallel (here: two n channel MOSFETs 25a, 25b), as well as two p-channel field effect transistors 26a, 26b (here: two p-channel MOSFETs 26a, 26b)—operating as active, high-resistance loads for the differential amplifier 24 and/or the n channel field effect transistors 25a, 25b.

The source of the first n channel field effect transistor 25a of the differential amplifier 24 is connected to the differential amplifier connection 27 (and thus also to the source of the n channel field effect transistor 21) via a line 28a.

In corresponding, symmetrical fashion the source of the second n channel field effect transistor 25b of the differential amplifier 24 is also connected to the differential amplifier connection 27 (and thus also to the source of the n channel field effect transistor 21), in fact via a line 28b.

The gate of the first n channel field effect transistor 25a is connected to a first input of the differential amplifier 24 via a line 29a, and the gate of the second n channel field effect transistor 25b to a second differential amplifier input via a line 29b.

The second differential amplifier input (line 29b) is connected to the second pulse connection 3b of the DDR-DRAM via a line 30 (where, as illustrated above—in normal working operational mode—the above first, differential clock pulse /CLK is present, or—in test mode—either (where differential test clock pulses are used) the above first, differential test clock pulse /CLK$_T$, or (where a single test clock pulse is used) no (test clock pulse) signal is present.

The above reference voltage VREF is applied to the first differential amplifier input (line 29a). The reference voltage is derived from the supply voltage, for instance by means of a voltage divider. The voltage level of the reference voltage VREF remains constant—as shown in FIG. 2—and may for instance amount to ca. half the level of the supply voltage.

In contrast to this—as also shown in FIG. 2—the voltage of the (test) clock pulse /CLK and/or /CLK$_T$ that may be present at the second differential amplifier input (line 29b), varies at regular chronological intervals between a voltage value of 0V (ground voltage), and the level of the supply voltage (i.e. essentially double the level of the reference voltage VREF), and/or between a VMf of $-\Delta U_{CLK}$ and $+\Delta U_{CLK}$.

Again referring to FIG. 1, the drain 25b of the second n channel field effect transistor at the differential amplifier 24, is connected via a line 31b to the differential amplifier-output, which is connected to an output line 36.

Both the differential amplifier outputs (line 31a, and lines 31b and/or 36) are—as is self-evident—connected at all times to the above-mentioned p-channel field effect transistors 26a, 26b acting as active loads to the differential amplifier 24 and/or the n channel field effect transistors 25a, 25b.

Furthermore, the drain of the second n channel field effect transistor 25b—is connected via a line 25b to the drain of the second p-channel field effect transistor 26b.

In similar fashion the first differential amplifier output (line 31a)—and thereby also the drain of the first n channel field effect transistor 25a—is connected via line 32a to the source of the first p-channel field effect transistor 26a.

The source of the second p-channel field effect transistor 26b is connected to the supply voltage via a line 33b connected to a line 33c; in similar manner the source of the first p channel field effect transistor 26a is also connected to the supply voltage (via a line 33a, which is also connected to the line 33a, which is in turn connected to the supply voltage).

As can be further seen from FIG. 1, the gates of both p channel field effect transistors 26a, 26b are connected to each other via a line 34, and via a line 35 to the line 32a (and thereby to the drain of the first p-channel field effect transistor 26a and the drain of the first n channel field effect transistor 25a).

By means of the p channel field effect transistors 26a, 26b (connected as shown above)—operating as active, high-resistance loads—it becomes possible for both (symmetrical) n channel field effect transistors 25a, 25b to be operated in the saturation range.

The bigger the differential between the voltage level of the (test-) clock pulse /CLK and/or /CLK$_T$ present at the second differential amplifier input (line 29b), and the level of the reference voltage VREF present at first differential amplifier input (line 29a), the bigger is the drain current $I_{D,b}$ flowing through the second n channel field effect transistor 25b and the lower is the voltage at the second differential amplifier output (line 31b and/or output line 36).

As further shown in FIG. 1, the second differential amplifier-output (line 31b and/or output line 36) is connected via a line 37 to the source of a further p channel field effect transistor 38, of which the source is connected via a line 33d to line 33a (and thereby via line 33c to the supply voltage), and of which the gate is connected to a line 39, where the above differential amplifier-enabling signal EN-diff is present, just as it is at the gate of the n channel field effect transistor 21.

If—for instance as is the case after putting the DDR component into operation—the differential amplifier-enabling signal ENdiff is "high logic", the further p channel field effect transistor 38 is switched off and/or blocked, i.e. has no influence on the voltage present at the second differential amplifier-output line 31b and/or output line 36 (instead of this it depends, as described above, on the difference between the level of the voltage of the (test) clock pulse /CLK and/or /CLK$_T$, and at the second differential amplifier input (line 29b) and the level of the reference voltage VREF present at the first differential amplifier input (line 29a).

If however, a "low logic" signal instead of a "high logic" signal is present at the gate of the further p channel field effect transistor 38 (and accordingly also at the gate of the n channel field effect transistor 21), the p-channel field effect transistor 38 is switched on and/or through (and accordingly the n channel field effect transistor 21 is switched off and/or blocked). The voltage at the second differential amplifier-output (line 31b and/or output line 36) is then (necessarily) lifted to that of the supply voltage potential. The voltage present at the second differential amplifier output then does not depend on the difference between the level of the voltage of the (test) clock pulse /CLK and/or /CLK$_T$, present at the second differential amplifier input (line 29b) and the level of the reference voltage VREF present at the first differential amplifier input (line 29a); the differential amplifier 24 and/or the clock pulse detection facility 2 are "blocked".

As further shown in FIG. 1, the second differential amplifier output (line 31b and/or output line 36) is connected via line 40 to the input of an inverter amplifier 41. The output of the inverter amplifier 41 is connected via a line 42 to a line 43, which is connected to the input of the counter device 7.

Furthermore, the line 42 connected to the inverter amplifier output—via a line 44a—is connected to a further inverter amplifier 46, which is connected—via a line 44b—to line 40 (and thereby to the input of the inverter amplifier 41). The output of the inverter amplifier 41 is also back-connected to the inverter amplifier input, with the further inverter amplifier 46 interposed.

Each of the inverter amplifiers 41 and 46 consists at any time of an n and a p channel field effect transistor, in which the source of the respective n channel field effect transistor is at any time connected to ground, and the source of the respective p channel field effect transistor at any time to the supply voltage.

The field effect transistors used in the inverter amplifiers 41, 46 therefore also always operate in source circuit, and amplify the input voltage present at the respective inverter input inversely, whereby the field effect transistor of one inverter amplifier 41, 46 always constitutes the operating resistance for the other field effect transistor.

Due to the above back-connection—and a corresponding dimensioning of the additional inverter amplifier 46—it is here achieved (in recognized fashion) that the switching on and switching off voltage levels of the inverter amplifier 41 depending on /CLK do not coincide, but differ by an inverter amplifier switching hysteresis $\Delta U_e$:

Only when the level of the voltage at the second differential amplifier input (line 29b) (/CLK) falls below a value $U_{e,aus}$ is that inverter amplifier (again) "switched over"; at the output of the inverter amplifier 41 there will then for instance be a "low logic" signal present (here: the supply voltage potential and/or ground potential)). Here $U_{e,aus}$ is smaller than $U_{e,ein}$, i.e. $U_{e,aus}-U_{e,ein}=\Delta U_e$ (switching hysteresis of the differential amplifier 24) applies.

In contrast to this it is only when the level of the voltage at the second differential amplifier-output (line 31b and/or output line 36)—and thereby the level of the voltage at the input of the inverter amplifier 41—(again) exceeds a value $U_{e,ein}$ (and not already at the value $U_{e,aus}$), that the inverter amplifier is (again) "switched over"; at the output of the inverter amplifier 41 there will then for instance be a "low logic" (or "high logic") signal present (here: the ground potential and/or the supply voltage potential). Consequently $U_{e,aus}$ is smaller than $U_{e,ein}$, i.e. $U_{e,aus}-U_{e,ein}=\Delta U_e$ (switching hysteresis of the inverter amplifier 41) applies.

Consequently, differing upper and lower switching points as illustrated in FIG. 2—occur at the clock pulse detection facility 2, depending on the level of the voltage of the (test) clock pulse /CLK and/or /CLK$_T$, present at the second differential amplifier input (line 29b), and on the—level of the reference voltage VREF present at the first differential amplifier input (line 29a), as well as on the resulting—level of the voltage present at the output of the inverter amplifier 41 (clock pulse detection facility switching hysteresis $\Delta U_{total}$):

Only when the level of the voltage of the (test) clock pulse /CLK and/or /CLK$_T$ present at the second differential amplifier input (line 29b) is higher than the level of the reference voltage VREF (plus a hysteresis $\Delta U_1$) present at the first differential amplifier input (line 29a), (i.e. only when the following applies:

$$/CLK > (VREF + \Delta U_1)$$

(and/or /CLK$_T$>(VREF+ΔU$_1$)), is that inverter amplifier 41 "switched off" (and is there then a "high logic" signal present at the output of the inverter amplifier 41).

In contrast, only when the level of the voltage of the (test) clock pulse /CLK and/or /CLK$_T$ present at the second differential amplifier input (line 29b) is (again) lower than the level of the reference voltage VREF present at the first differential amplifier input (line 29a), minus a hysteresis ΔU$_2$ (i.e. only when the following applies:

/CLK<(VREF−ΔU$_2$)

(and/or /CLK$_T$<(VREF−ΔU$_2$)), is the inverter amplifier 41 (again) "switched on" (is there then a "low logic" signal present at the output of the inverter amplifier 41).

Therefore the following applies to the above (total) switching hysteresis of the clock pulse detection facility 2:

ΔU$_{total}$=(VREF+ΔU1)−(VREF−ΔU$_2$)

As mentioned above, the signal present at the output of the inverter amplifier 41 is relayed via lines 42, 43 to the input of the counter device 7.

Every time the signal present on lines 42, 43 changes its state first from "low logic" to "high logic" and then back again to "low logic", does the counter reading Z—which, as mentioned above during the putting into operation of the DDR components, was first reset to a reading Z of "zero" (i.e. a initial counter reading value of Z$_0$=0)—as shown in FIG. 2—does the reading Z of the counter device 7 increase by "one" (i.e. with the first negative pulse flank of the (test) clock pulse /CLK and/or /CLK$_T$ it changes from "zero" to "one", with the next negative pulse flank of the (test) clock pulse /CLK and/or /CLK$_T$ from "one" to "two", etc.)

By means of the hysteresis ΔU$_{total}$ of the clock pulse detection facility 2 illustrated above, it can be prevented that even relatively small fluctuations—simply due to interference—between the levels of the (test) clock pulse /CLK and/or /CLK$_T$ and the reference voltage VREF present at the inverter amplifier (line 29a), can—erroneously—switch over the first differential amplifier 41 and erroneously increase the counter reading Z of the counter device 7.

As already illustrated above, the counter device 7 first (e.g. with a counter reading of Z "zero", i.e. with an initial counter reading value Z$_0$=0)) emits a "low logic" signal at the output of the counter device 7. Only when the counter reading Z reaches a predetermined value of Z$_{vor}$, does the counter device 7—instead of a "low logic" signal—emit a "high logic" signal so that the OUTPUT signal at the output 10 of the circuit device 1 changes its state from "low logic" to "high logic".

The predetermined counter reading Z$_{vor}$, at which the signal emitted by counter device 7 changes its state from "low logic" to "high logic", may for instance lie "two" and "sixty four" (i.e. 2<Z$_{vor}$<64), more particularly between "eight" and "thirty two" (i.e. 8<Z$_{vor}$<32), e.g. equal to "sixteen" (i.e. Z$_{vor}$=16).

Each time the counter reading Z is increased by "one" it can be assumed that—as shown in FIG. 2—one (further) single pulse S1, S2, S3, S4 of a (test) clock pulse /CLK and/or /CLK$_T$ present at the second pulse connection 3b has been detected.

When the counter reading Z reaches the above predetermined counter reading value Z$_{vor}$ (and it is likely that a relatively high number (here e.g. Z$_{vor}$=16) of single pulses S1, S2, S3, S4 has been detected) can it be assumed that the (test) clock pulse /CLK and/or /CLK$_T$ is present at the second pulse connection 3b (and consequently that at the whole component—more particularly at one of its pulse connections 3a, 3b—there are differential clock pulses present (more particularly the above pulse and/or test clock pulse CLK and/or CLK$_T$ at the first pulse connection 3a, and the above—inverted thereto—pulse and/or test clock pulse /CLK and/or /CLK$_T$ at the second pulse connection 3b)).

This is indicated—as illustrated—by the signal OUTPUT at output 10 of circuit device 1 assuming a "high logic" state.

If however the counter reading Z of the counter device 7 remains at the initial value Z$_0$=0, or if the counter reading Z remains below the predetermined counter reading value Z$_{vor}$, it can be assumed that there is no (test) clock pulse /CLK and/or /CLK$_T$ present at the second pulse connection 3b (and that there is one single ended clock pulse, the above single pulse and/or single test clock pulse CLK and/or CLK$_T$, present at the component as a whole (more particularly at the first pulse connection 3a)).

Depending on whether it is determined that there are a single clock pulse and/or test clock pulse, or differential clock pulse and/or test clock pulses present at the component, a special pulse relaying device, specially provided for instance for single clock pulses or a clock pulse relaying device specially provided for differential clock pulses, can be used to receive corresponding clock pulses present at the first pulse connection 3a, or at the first and second pulse connections 3a, 3b (via lines 45a, 45b) and to relay these (for instance suitably retimed, reshaped and reamplified) to further circuit devices provided in the component.

If—as illustrated above—it is detected that there are differential clock pulses present at the component—and the counter device 7 one emits a corresponding "high logic" signal—this "high logic" signal is relayed via lines 9 and 11 to the input of the inverter 12.

The inverter 12 then emits one inverted, i.e. "low logic" signal /OUTPUT at its output.

This "low logic" signal /OUTPUT is led via line 13 to the first input of the AND switching link 14, whose output (i.e. line 15) then emits a "low logic" signal, applied to the gate of the n channel field effect transistor 18. This causes the n channel field effect transistor 18 to be switched off and/or out (i.e. to become non-conductive)—the differential amplifier 24 and/or the clock pulse—detection facility 2 are—as also illustrated above—then "blocked" and/or switched off.

This prevents an unnecessarily high current consumption—i.e. during the application of differential clock pulses—in the normal operating mode.

We claim:

1. A circuit device (1), comprising at least a first connection (3a) and a second connection (3b), adapted to receive a single clock pulse (CLK, CLK$_T$) at the first connection (3a), and adapted—alternatively to the single clock pulse (CLK, CLK$_T$)—to receive a differential clock pulse (CLK, CLK$_T$, /CLK, /CLK$_T$) at the first and second connections (3a, 3b), and a detection facility (2) to detect which kind of clock pulse (CLK, CLK$_T$), (CLK, CLK$_T$, /CLK, /CLK$_T$) is received, the detection facility (2) having a first state, if a differential clock pulse (CLK, CLK$_T$, /CLK, /CLK$_T$) is received at the first and second connections (3a, 3b), in which a first output signal is provided, and a second state, if a single clock pulse (CLK, CLK$_T$) is received at the first connection (3a), in which a second output signal different than the first output signal is provided.

2. A circuit device (1) comprising:
   at least a first connection (3a), to which a clock pulse (CLK, CLK$_T$) can be applied, and a second connection (3b), to which a clock pulse (/CLK, /CLK$_T$) can be applied;

a detection facility (2) which in determining whether a clock pulse (/CLK, /CLK$_T$) is present at the second connection (3b), determines whether there are differential clock pulses (CLK, CLK$_T$; /CLK, /CLK$_T$) present at the connections (3a, 3b), or whether there is a single clock pulse (CLK, CLK$_T$) present at the first connection (3a), but not at the second connection (3b);

a comparison device (24) for comparing the signal present at the connection (3b), in particular the clock pulse (/CLK, /CLK$_T$) applied thereto, with a reference signal (VREF); and a counter device (7), in particular for detecting the number of pulses, particularly clock pulse detection signals, emitted by the comparison device (24).

3. A circuit device (1) according to claim 2, in which the comparison device (24) comprises a differential amplifier.

4. A circuit device (1) according to claim 2, in which the comparison device (24) emits a pulse, more specifically a clock pulse detection signal, when the level of the signal present at the connection (3b) exceeds or falls below a predetermined level (VREF), in particular, the level of the reference signal (VREF).

5. A circuit device (1) according to claim 2, in which the comparison device (24) emits a signal, more specifically a clock pulse detection signal, when the level of the signal present at the connection (3b) first exceeds a predetermined, first level (VREF+$\Delta U_1$), and then falls below a predetermined second level (VREF−$\Delta U_2$) that differs from the first level.

6. A circuit device (1) according to claim 2, in which the comparison device (24) then emits a pulse, more specifically a clock pulse detection signal, when the level of the signal present at the connection (3b) first falls below a predetermined first level and then exceeds a predetermined second level that differs from the first level.

7. A circuit device (1) according to claim 2, in which, when the number (Z) of pulse, in particular clock pulse detection signals emitted by the comparison device (24), and detected by the counter device (7), is larger then or equal to a predetermined number ($Z_0$), it is determined that the clock pulse (/CLK, /CLK$_T$) is present at the connection (3b).

8. A semi-conductor component that comprises at least one circuit device (1) comprising:

at least a first connection (3a) and a second connection (3b), adapted to receive a single clock pulse (CLK, CLK$_T$) at the first connection (3a) and adapted—alternatively to the single clock pulse (CLK, CLK$_T$)—to receive a differential clock pulse (CLK, CLK$_T$; /CLK, /CLK$_T$) at the first and second connections (3a, 3b); and a detection facility (2) to detect which kind of clock pulse (CLK, CLK$_T$), (CLK, CLK$_T$; /CLK, /CLK$_T$) is received, the detection facility (2) having a first state, if differential clock pulses (CLK, CLK$_T$; /CLK, /CLK$_T$) are received at the connections (3a, 3b), in which a first output signal is provided, and a second state, if a single clock pulse (CLK, CLK$_T$) is received at the first connection (3a), in which a second output signal different than the first output signal is provided.

9. A semi-conductor component according to claim 8, which is a DDR (double data rate) component, in particular a DDR memory component.

10. A semi-conductor component according to claim 8, in which the memory component is a DRAM (dynamic random access memory).

* * * * *